United States Patent
Ichikawa et al.

(10) Patent No.: US 6,344,412 B1
(45) Date of Patent: Feb. 5, 2002

(54) INTEGRATED ESD PROTECTION METHOD AND SYSTEM

(75) Inventors: Steven Ichikawa, Fremont; Boonmi Mekdhanasarn, Sunnyvale; Abdul R. Ahmed, Morgan Hill, all of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/522,725

(22) Filed: Mar. 10, 2000

Related U.S. Application Data

(62) Division of application No. 09/330,255, filed on Jun. 10, 1999.

(51) Int. Cl.$^7$ .............................................. H01L 21/44
(52) U.S. Cl. ...................................... 438/661; 438/681
(58) Field of Search .................................. 438/661, 681

(56) References Cited

U.S. PATENT DOCUMENTS

| | | | | |
|---|---|---|---|---|
| 5,106,540 A | | 4/1992 | Barma et al. ................ | 252/511 |
| 5,178,797 A | | 1/1993 | Evans ......................... | 252/508 |
| 5,183,692 A | * | 2/1993 | Mukerji et al. .............. | 427/304 |
| 5,227,946 A | | 7/1993 | Jacobs et al. ................ | 361/106 |
| 5,250,228 A | | 10/1993 | Baigrie et al. ............... | 252/511 |
| 5,298,194 A | | 3/1994 | Carter et al. ................. | 252/512 |
| 5,300,760 A | | 4/1994 | Batliwalla et al. .......... | 219/549 |
| 5,378,407 A | | 1/1995 | Chandler et al. ............. | 252/513 |
| 5,382,384 A | | 1/1995 | Baigrie et al. .............. | 252/511 |
| 5,451,919 A | | 9/1995 | Chu et al. ................... | 338/22 R |
| 5,580,493 A | | 12/1996 | Chu et al. ................... | 252/511 |
| 5,582,770 A | | 12/1996 | Chu et al. ................... | 252/511 |
| 6,011,123 A | * | 1/2000 | Kurosawa et al. .......... | 525/431 |
| 6,171,460 B1 | * | 1/2001 | Bill ............................ | 204/291 |
| 6,214,749 B1 | * | 4/2001 | Watanabe et al. ........... | 438/783 |

FOREIGN PATENT DOCUMENTS

JP             58113250     *    6/1983        H01L/21/58

* cited by examiner

*Primary Examiner*—Charles Bowers
*Assistant Examiner*—Thanh Nguyen
(74) *Attorney, Agent, or Firm*—Skjerven Morrill MacPherson LLP

(57) ABSTRACT

An ESD structure is created on an integrated circuit by providing a conductive polymer material between a signal line and a supply node or ground reference. The conductive polymer material becomes conductive when an electric field of sufficient intensity is applied. In one embodiment, the concentration of conductive particles of the conductive polymer material is empirically determined so that the resulting film becomes conducting at a predetermined threshold voltage. The conductive polymer is applied in liquid form on the wafer surface using a silk-screen printing process or a spin-on process and then cured. The conductive polymer layer can be adapted for use in multilevel metallization systems.

9 Claims, 2 Drawing Sheets

INTEGRATED ESD PROTECTION METHOD AND SYSTEM

This application is a Div. of Ser. No. 09/330,255 filed Jun. 10, 1999.

BACKGROUND OF THE INVENTION

1. Field of the Invention

The present invention relates to protection in an integrated circuit against electrostatic discharge (ESD). In particular, the present invention relates to integrating conductive polymer material on-chip to provide ESD protection.

2. Discussion of the Related Art

Mixing conductive and semi-conductive particles in an insulating polymer matrix can create a conductive polymer. In one instance, the conductive particles are aluminum spheres of several hundredths of a micron in diameter and each coated in a ceramic film several angstroms thick. Using an appropriate concentration of these conductive particles in the insulating polymer matrix, the particles can be spaced sufficiently close to each other to allow Fowler-Nordheim tunneling to occur. An example of such a polymer material, called "Surgx", can be obtained from Surgx Corporation, Fremont, Calif.

The conductive polymer described above is insulating below certain electric field intensity (e.g. 10 volts per micron), but becomes highly conductive when the electric field intensity threshold is reached. FIG. 1 shows an electrical characteristic of a conductive polymer film. As shown in FIG. 1, as voltage is increased from 0 volts to about 5 volts (segment 103) across the conductive polymer film, the conductive polymer film is substantially insulating until threshold or "trigger" point 100 is reached At trigger point 100, the conductive polymer film exhibits a "snap-back" phenomenon, in which the conductivity of the polymer film increases rapidly. As shown in FIG. 1, during snap-back, the voltage across conductive polymer film drops rapidly along segment 102, and thereafter, the current through the conductive polymer film increases substantially along segment 101. If the electrical field across the conductive polymer film is subsequently returned to a voltage below the snap-back voltage, however, the conductive polymer film returns to the pre-trigger insulating condition.

SUMMARY OF THE INVENTION

The present invention provides a method for creating a conductive polymer material on a semiconductor wafer. The conductive polymer material can be used to provide electrostatic discharge (ESD) protection in an integrated circuit.

In one embodiment of the present invention, the conductive polymer can be formed by: (a) applying on the surface of a semiconductor wafer a liquid film including polyamic acid, an organic solvent, and conductive particles; and (b) curing the liquid film at a sufficiently high temperature to cause polymerization of the polyamic acid and to evaporate the organic solvent to form a conductive polymer layer. The conductive polymer layer can be patterned by first providing a patterned masking layer over the conductive polymer layer; and etching the conductive layer in the presence of the patterned masking layer.

In an ESD application, the surface of the semiconductor wafer is first provided a patterned metallization layer prior to applying the liquid film. To provide ESD protection in a multilevel metallization system, a second layer of patterned metallization can be provided over the conductive polymer layer. In one embodiment including multilevel metallization, a dielectric layer is deposited over a first patterned metallization layer; and then openings are provided in the dielectric layer to form vias connecting metal lines in the first metallization layer to a subsequently formed second metallization layer. In that configuration, the conductive polymer material fills the via openings in the dielectric layer.

The concentration of the conductive particle in the conductive polymer material can be empirically determined. A sufficient concentration of the conductive particles is provided so that the conductive polymer becomes conducting when an electric field having an intensity above a predetermined threshold is applied across the polymer material.

In one embodiment, a passivation layer is provided above the conductive polymer layer. In one embodiment, the curing step is carried out by: (a) baking the liquid film at a first temperature over a predetermined time interval to create a polymerized layer without substantial cross-linking; and (b) baking the polymerized layer at a second temperature lower than the first temperature over a second time interval sufficient to eliminate the organic solvent. In another embodiment, after the organic solvent is eliminated, a hard curing step is carried out by baking the polymerized layer at a third temperature above the second temperature. The third temperature is selected to be sufficiently high to allow a cross-linking reaction in the polymerized layer to complete. If the polymer film is to be patterned, the hard curing step can be carried out simultaneously as the hard baking step in conventional processing of a developed photoresist layer.

According to the present invention, an ESD structure includes: (a) a first metal line provided on a semiconductor substrate for carrying an electrical signal; (b) a second metal line provided on the semiconductor substrate for carrying a supply voltage or a ground reference; and (c) a conductive polymer material in contact with the first and second metal lines. When the conductive polymer material becomes conductive when a sufficiently high voltage appears across the first and the second metal lines, such as when an electrostatic charge appears on the first metal line, the electrostatic charge is shunted to the supply voltage node or the ground reference. In one configuration, the polymer material is patterned. In another configuration, the conductive polymer material is provided as a blanket layer. In a third configuration, the first and second metal lines being provided on two levels of metallization. In a fourth configuration, the conductive polymer material fills openings in an interconnect dielectric layer. In that configuration, the openings connect metal lines in different levels of a multilevel metallization system. An insulating passivation layer is typically provided over the entire structure for mechanical protection.

The present invention is better understood upon consideration of the detailed description below and the accompanying drawings.

BRIEF DESCRIPTION OF THE DRAWINGS

In these figures, and in the detailed description below, like elements are provided like reference numerals.

DETAILED DESCRIPTION OF THE PREFERRED EMBODIMENTS

In one embodiment of the present invention, a liquid Surgx material is obtained which includes a polyamic acid, and conductive and non-conductive particles suspended in an n-methyl-propyrrolidene (NMP) solvent.

The liquid Surgx material is applied on the surface of a semiconductor wafer using either a spin-on process or a silkscreen printing process. In a spin-on process, the liquid Surgx material has preferably a viscosity of 5 to 15 Kcps. A film thickness of about 25 microns or less can easily be formed. The Surgx material is then allowed to partially polymerize at a temperature between 200° C. to 300° C. for two hours. Then, the solvent in the partially polymerized film is then substantially completely evaporated at a temperature between 100° C. to 120° C. for two hours. At this point, the partially polymerized film is said to be "soft-cured".

Figure 1:
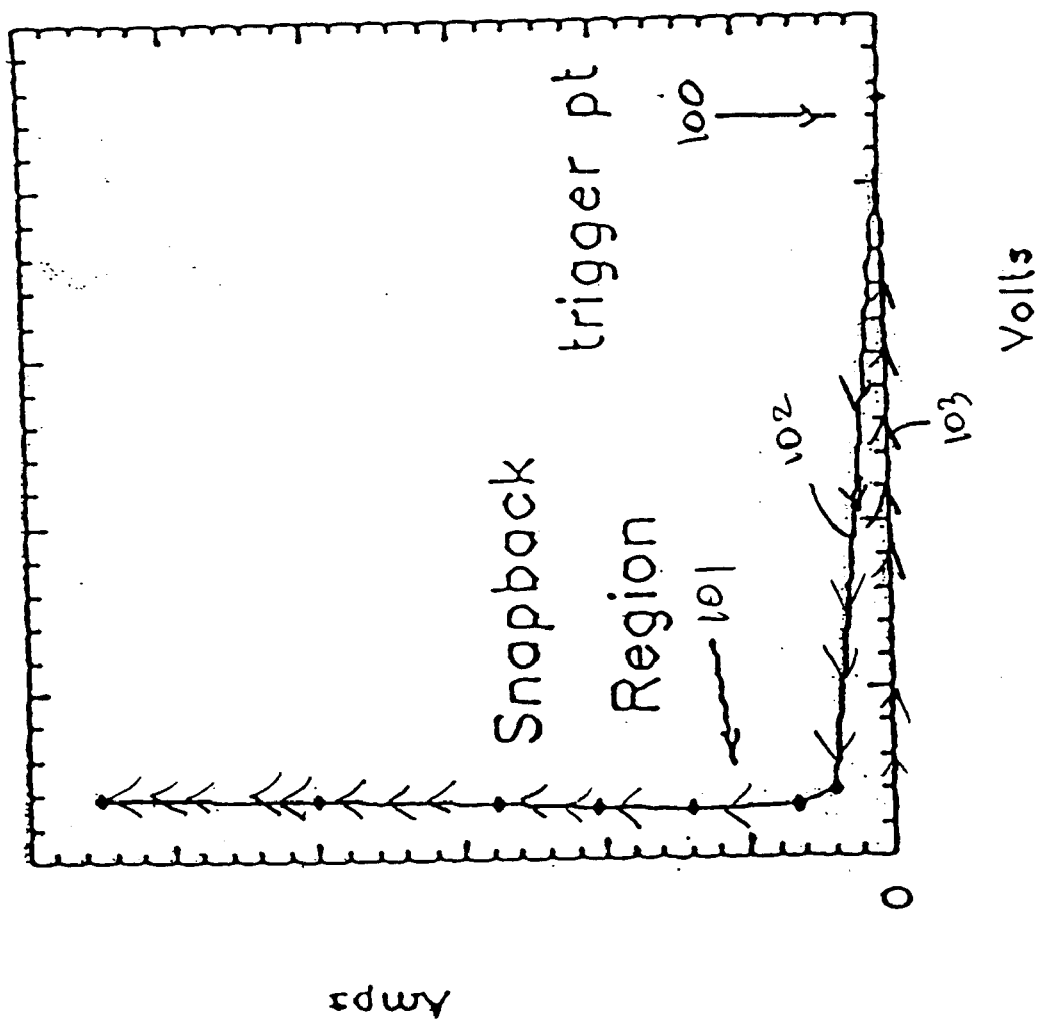
FIG. 1 shows an electrical characteristic of a conductive polymer film.

Then, a layer of photoresist is applied on the surface of the soft-cured partially polymerized film, exposed and developed using conventional photolithographical techniques to provide a pattern in the photoresist layer. The semiconductor wafer, which now includes the soft-cured partially polymerized film and the developed photoresist layer is then subject to a conventional "hard bake" step to harden the developed photoresist layer at between 200° C. to 250° C. for two hours. During this step, the soft-cured partially polymerized film becomes "hard-cured", i.e., cross-linking in the polymerized film takes place, to create a conductive polymer film having the electrical characteristics shown in FIG. 1. For a given application, the necessary breakdown characteristics (i.e., the threshold or trigger point) can be empirically determined by varying the concentration of non-conductive and conductive particles.

The pattern in the photoresist layer can then be transferred into the polymer film using a conventional etch process in a polyimide etcher (e.g., a polyimide etcher obtainable from Hitachi Corporation, Japan).

Figure 2A:
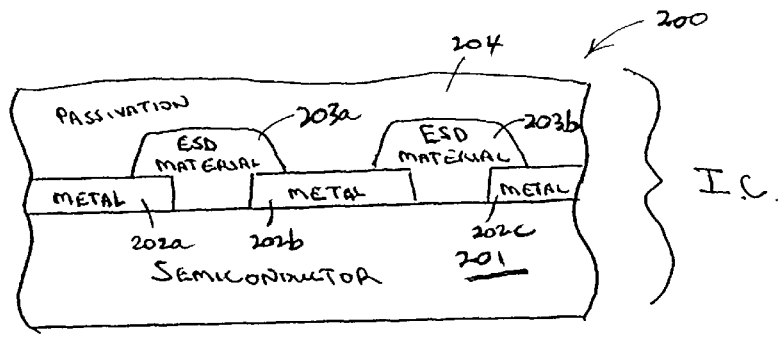
FIG. 2a shows configuration 200 for protection against ESD in an integrated circuit, in accordance with the present invention.

The conductive polymer film thus formed can be used to protect an integrated circuit against electrostatic discharge (ESD). One example of a structure for protection against ESD, in accordance with the present invention is provided by configuration 200 of FIG. 2a. In FIG. 2a, metal traces 202a, 202b and 202c are fabricated on the surface of semiconductor substrate 201. A polymer film is then formed and patterned using the method described above to provide conductive polymer traces 203a and 203b. A passivation layer (e.g., borophosphosilicon glass) is then provided over the surface of the wafer. In configuration 200, metal traces 202a and 202c are, for example, input leads for receiving external signals into the integrated circuits, and are thus exposed to electrostatic discharge from an external source. Metal trace 202b can be a lead connected to either a supply voltage node or a ground reference. When an ESD event occurs, say at metal trace 202a, the charge associated with the ESD event creates momentarily a voltage difference between metal trace 202b and metal trace 202a. Polymer trace 203a limits this voltage difference to the trigger voltage (e.g., 5 to 10 volts) and becomes conductive. Consequently, the charge in metal trace 202a is shunted through polymer trace 203a to metal trace 202b to the ground reference or the supply node, thus preventing a high voltage from being developed on metal trace 202a. Damage in the electronic circuits coupled to metal trace 202a is thereby avoided.

Figure 2B:
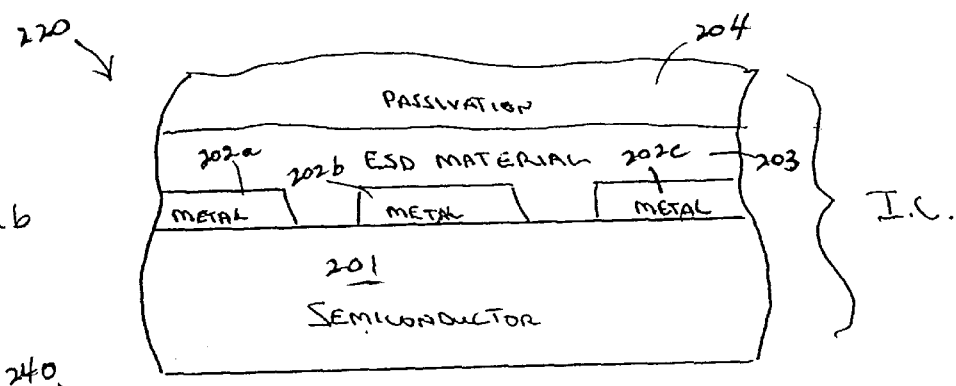
FIG. 2b shows configuration 220 for protection against ESD in an integrated circuit, in accordance with the present invention.

FIG. 2b shows another configuration 220 for protection against ESD in an integrated circuit, in accordance with the present invention. In configuration 220, a blanket conductive polymer layer 203 is provided. Since patterning is not required, the photoresist application, exposure, development and etching steps are not necessary. The soft-cured partially polymerized layer is instead hard-cured at a temperature between 200° C. to 250° C. for two hours to form conductive polymer layer 203. Passivation layer 204 is then provided on conductive polymer layer 203.

Figure 2C:
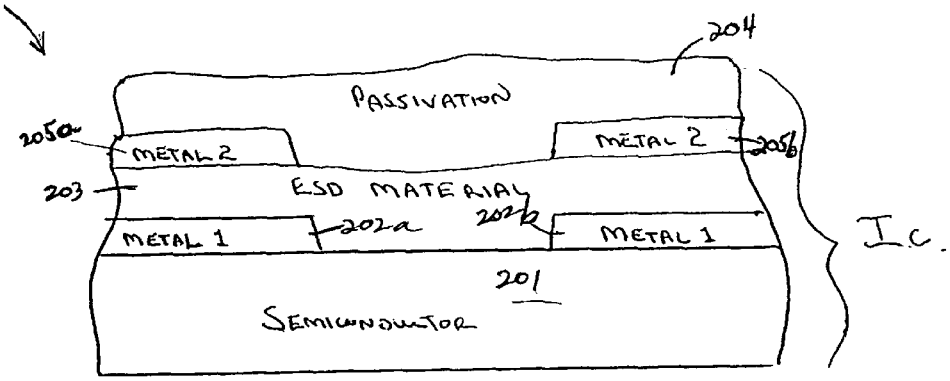
FIG. 2c shows configuration 240 for protection against ESD in an integrated circuit, in accordance with the present invention.

FIG. 2c shows third configuration 240 for protection against ESD in an integrated circuit, in accordance with the present invention. In FIG. 2c, configuration 240 includes two levels of interconnect metallization represented by metal traces 202a, 202b, 205a and 205b. Conductive polymer layer 203 is provided between the two levels of interconnect metallization. The metal layer forming metal traces 205a and 205b can be formed and processed in a conventional manner on the surface of conductive polymer layer 203.

Figure 2D:
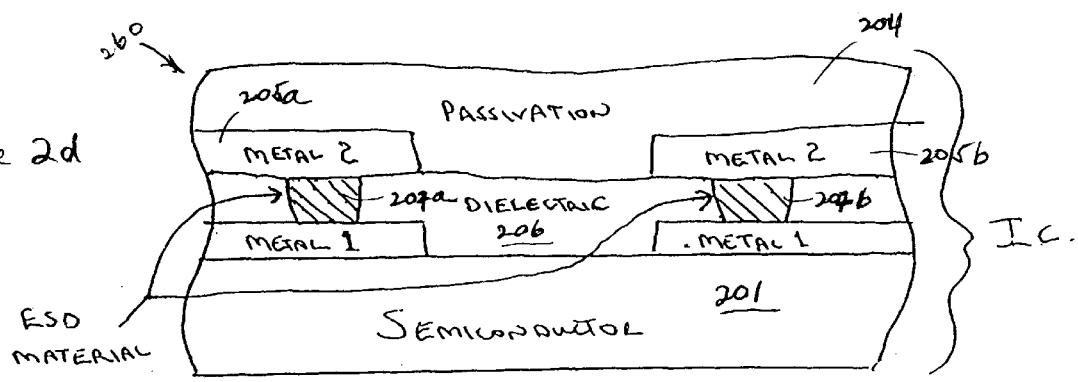
FIG. 2d shows configuration 260 for protection against ESD in an integrated circuit, in accordance with the present invention.

FIG. 2d shows fourth configuration 260 for protection against ESD in an integrated circuit, in accordance with the present invention. As in FIG. 2c, two levels of metallization represented by metal traces 202a, 202b, 205a and 205b are provided. However, instead of a blanket polymer layer 203, interlayer dielectric layer 206 (e.g., a deposited oxide layer) is provided over metal traces 202a and 202b. Subsequently, via openings are created in interlayer dielectric layer and filled by conductive polymer material to form conductive polymer vias 207a and 207b.

The detailed description above is provided to illustrate the specific embodiments of the present invention and is not intended to be limiting. Numerous modifications and variations within the scope of the present invention are possible. The present invention is set forth in the following claims.

We claim:

1. A method for providing conductive polymer, comprising:

applying on the surface of a semiconductor wafer a liquid film including polyamic acid, an organic solvent, and conductive particles; and curing said liquid film at a sufficiently high temperature to cause polymerization of said polyamic acid and to evaporate said organic solvent to form a conductive polymer layer;

wherein said liquid film includes conductive particles in sufficient concentration such that said conductive polymer layer becomes conductive only when an electric field having an intensity above a predetermined threshold is applied across said film.

2. A method as in claim 1, further comprising:

providing a patterned masking layer over said conductive polymer layer; and etching said conductive layer in the presence of said patterned masking layer.

3. A method for providing conductive polymer, comprising:

applying on the surface of a semiconductor wafer a liquid film including polyamic acid, an organic solvent, and conductive particles; and curing said liquid film at a sufficiently high temperature to cause polymerization of said polyamic acid and to evaporate said organic solvent to form a conductive polymer layer;

wherein said surface of said semiconductor wafer is provided a patterned metallization layer prior to said applying step.

4. A method as in claim 3, further comprising the step of providing a second layer of patterned metallization over said conductive polymer layer.

5. A method as in claim 3, further comprising, prior to said applying step:

depositing a dielectric layer over said patterned metallization layer; and providing in said dielectric layer openings for contacting said patterned metallization layer.

6. A method as in claim 3, wherein said liquid film includes conductive particles in sufficient concentration such that said conductive polymer layer becomes conductive only when an electric field having an intensity above a predetermine threshold is applied across said film.

7. A method as in claim 1, further comprising providing a passivation layer above said conductive polymer layer.

8. A method for providing conductive polymer, comprising:

applying on the surface of a semiconductor wafer a liquid film including polyamic acid, an organic solvent, and conductive particles; and curing said liquid film at a sufficiently high temperature to cause polymerization of said polyamic acid and to evaporate said organic solvent to form a conductive polymer layer;

wherein said curing comprises:

baking said liquid film at a first temperature over a predetermined time interval to create a polymerized layer without substantial cross-linking; and baking said polymerized layer at a second temperature lower than said first temperature over a second time interval sufficient to eliminate said organic solvent.

9. A method as in claim 8, said curing further comprises, subsequent to baking said polymerized layer at said second temperature, baking said polymerized layer at a third temperature above said second temperature to provide said conductive polymer layer, said third temperature being sufficiently high to allow cross-linking reaction in said polymerized layer.

* * * * *